US009054709B2

(12) United States Patent
Chu

(10) Patent No.: US 9,054,709 B2
(45) Date of Patent: Jun. 9, 2015

(54) TOUCH-SENSITIVE ROTARY SWITCH

(71) Applicant: Ching-Hsiung Chu, New Taipei (TW)

(72) Inventor: Ching-Hsiung Chu, New Taipei (TW)

(\*) Notice: Subject to any disclaimer, the term of this patent is extended or adjusted under 35 U.S.C. 154(b) by 442 days.

(21) Appl. No.: 13/633,882

(22) Filed: Oct. 3, 2012

(65) Prior Publication Data

US 2014/0042002 A1 Feb. 13, 2014

(30) Foreign Application Priority Data

Aug. 9, 2012 (TW) .............................. 101128794 A

(51) Int. Cl.
*H03K 17/94* (2006.01)
*H01H 9/00* (2006.01)
*H03K 17/96* (2006.01)

(52) U.S. Cl.
CPC ........ *H03K 17/9622* (2013.01); *H03K 17/9647* (2013.01); *H03K 2217/96066* (2013.01); *H03K 2217/960785* (2013.01)

(58) Field of Classification Search
None
See application file for complete search history.

(56) References Cited

U.S. PATENT DOCUMENTS

| 7,269,485 | B2* | 9/2007 | Oikawa et al. ..................... 701/1 |
| 7,669,770 | B2* | 3/2010 | Wheeler et al. .......... 235/472.01 |
| 7,969,330 | B2* | 6/2011 | Philipp ........................... 341/33 |
| 2011/0156931 | A1* | 6/2011 | Chen et al. ...................... 341/35 |

\* cited by examiner

*Primary Examiner* — George Bugg
*Assistant Examiner* — Renee Dorsey

(57) ABSTRACT

A touch-sensitive rotary switch is configured to be touched along a rotary path, thereby turning on or off, or adjusting stepwise the magnitude of power supplied from, an external power source. The rotary switch includes a housing whose top portion has a sensing surface. A touch control circuit board is provided in the housing and topped with a touch control circuit layer whose peripheral region is divided into multiple sensing areas in which plural first light-emitting elements are annularly arranged. The sensing areas can be sequentially triggered by touching the sensing surface along its peripheral region, so as for the corresponding portion of the touch control circuit layer to control light emission of the first light-emitting elements corresponding to the triggered sensing areas and to output a coded signal according to the triggered sensing areas in order to control the power supplied from the external power source.

10 Claims, 5 Drawing Sheets

TOUCH-SENSITIVE ROTARY SWITCH

BACKGROUND OF THE INVENTION

1. Technical Field

The present invention relates to a touch-sensitive rotary switch and, more particularly, to a switch configured to be touched along a rotary path so as to turn on or off, or adjust stepwise the magnitude of power supplied from, an external power source.

2. Description of Related Art

Consumer electronics such as computers, communication devices, and home appliances are often equipped with rotary switches. Typically, a rotary switch is used to switch on or off a power source or adjust the magnitude of power supplied therefrom, thereby adjusting the operation speed or output power of an electric appliance powered by the power source. For example, a rotary switch may be used to adjust the rotation speed of an electric fan, the coolness of an air conditioner, the acoustic volume of a loudspeaker, the signal strength of a radio, and so forth.

As is well known, most rotary switches are composed of mechanical structures which include a switch main body, a spindle pivotally connected to the switch main body and configured to be turned by the user, and a knob provided at the top of the spindle to facilitate turning by the user. Generally, a rotary switch is electrically connected to the circuit of an electric appliance, and the resistance of the rotary switch can be controlled by the spindle for current and voltage adjustment. Thus, the power supplied to the circuit from an external power source can be controlled to thereby control the operation speed and output power of the electric appliance.

However, the mechanical rotary switch described above is an analog control device with relatively low precision in control. Moreover, the mechanical components of a mechanical rotary switch tend to get loose, malfunction, or become damaged after long-term and frequent use, not to mention that a deposition of dust or a buildup of grime on the mechanical components may, if not shortening the service life of the rotary switch, compromise the ability of the rotary switch to adjust and control a power source.

In view of the above, the inventor of the present invention put years of practical experience in the manufacture and design of electronic switches into extensive research and experiment and finally succeeded in developing the present invention for overcoming the aforementioned problems.

BRIEF SUMMARY OF THE INVENTION

The primary object of the present invention is to provide a switch configured to be touched along a rotary path so as to turn on or off an external power source or adjust in steps the magnitude of power supplied from the external power source. The present invention is intended to improve the low control precision typical of the conventional mechanical rotary switches; overcome the problem that the internal components of a mechanical rotary switch tend to get loose, malfunction, or become damaged after long-term and frequent use; and prevent the deposition or buildup of dust or grime that is likely to impair normal operation and lead to a shortened service life.

To achieve the above and other objects, the touch-sensitive rotary switch of the present invention includes:

a housing which forms a receiving chamber therein and whose top portion forms a sensing surface to be touched by a human hand;

a touch control circuit board which is provided in a top portion of the receiving chamber and whose top surface has a touch control circuit layer adjacent to the sensing surface, wherein the top surface of the touch control circuit layer has a peripheral region divided into a plurality of annularly arranged sensing areas; and a plurality of first light-emitting elements annularly provided in the sensing areas on the top surface of the touch control circuit layer and arranged in a spaced manner along a band corresponding to a peripheral region of the sensing surface.

A user may touch the sensing surface along its peripheral region to trigger the sensing areas of the touch control circuit layer sequentially. The portion of the touch control circuit layer that corresponds to the triggered sensing areas will, in response, control light emission of the first light-emitting elements corresponding to the triggered sensing areas and output a coded signal according to the triggered sensing areas in order to control the power supplied from an external power source.

Hence, by touching the sensing surface along its peripheral region, the portion of the touch control circuit layer that falls in the sensing areas corresponding to the touched portion of the peripheral region of the sensing surface can be driven to generate and output a coded signal for controlling the magnitude of power supplied from an external power source. This enables the user to adjust the power supply state of the external power source by touching the sensing surface with a rotary motion. In addition, the first light-emitting elements in the sensing areas corresponding to the touched portion of the peripheral region of the sensing surface can be driven to emit light or stopped from emitting light by the user's touch, as a way to notify the user of the current use state of the rotary switch.

Thus, the aforesaid object of turning on or off, or making stepwise adjustment to the power supplied from, an external power source by a touch along a rotary path can be achieved, and the service life of the rotary switch of the present invention is expected to be far longer than those of the conventional mechanical rotary switches. Also, the foregoing touch-based operation for adjusting the power supplied from an external power source is rather simple, easy to perform, and truly practical.

A further description of how to implement the present invention is given below:

In addition to the major technical features described above, the housing includes an upper cover and a lower cover. A top portion of the upper cover has a window in which a light-permeable element is provided. The sensing surface is the top surface of the light-permeable element, and the touch control circuit board is provided between the light-permeable element and the lower cover.

In addition to the major technical features described above, the sensing surface can be touched stepwise along its peripheral region such that the first light-emitting elements corresponding to the touched portion of the peripheral region of the sensing surface are turned on or off stepwise and the touch control circuit layer is driven to output the coded signal.

In addition to the major technical features described above, when an aforesaid sensing area is triggered by a touch that is subsequently removed, the first light-emitting elements corresponding to the sensing area keep emitting light, and when this sensing area is triggered again by a touch, the corresponding first light-emitting elements stop emitting light.

Alternatively, when an aforesaid sensing area is triggered by a touch that is subsequently removed, the first light-emitting elements corresponding to the sensing area stop emitting light.

In addition to the major technical features described above, the coded signal turns on the external power source and/or gradually increases the power supplied from the external power source, or the coded signal gradually decreases the power supplied from the external power source and/or turns off the external power source.

In addition to the major technical features described above, the coded signal is in a pulse-width modulation format.

In addition to the major technical features described above, at least one second light-emitting element is provided at the center of the top surface of the touch control circuit layer and surrounded by the sensing areas. Thus, the center of the top surface of the touch control circuit layer forms a pressing area corresponding to the center of the sensing surface. By touching the center of the sensing surface, the pressing area of the touch control circuit layer is triggered, and the portion of the touch control circuit layer that corresponds to pressing area is thereby driven to control light emission of the at least one second light-emitting element and output a control signal for controlling the power supplied from the external power source.

In addition to the major technical features described above, the at least one second light-emitting element changes the color of its light when the center of the sensing surface is touched.

In addition to the major technical features described above, the receiving chamber has a bottom portion provided with a plurality of supporting elements. The touch control circuit board is provided on a top portion of the supporting elements. A vibration motor is provided at a position surrounded by the supporting elements and can be driven by the control signal.

The present invention has the following advantages over the prior art:

1. A user may touch the peripheral region of the sensing surface with a rotary motion that the user is accustomed to. This enables the user to adjust and control at will the magnitude of power supplied from an external power source. Besides, the operation is simple and can be completed rapidly and conveniently.

2. Now that the touch control circuit board, which allows the power supplied from an external power source to be adjusted by touch rather than in a mechanical manner typical of the conventional rotary switches, is used in place of the conventional mechanical components, which are subject to wear and tear and may easily get stuck, the rotary switch of the present invention shall have a much longer service life than its mechanical counterparts.

3. Free of the conventionally required mechanical rotating components, the rotary switch of the present invention may have a watertight configuration to effectively prevent liquid from seeping into the switch structure and further increase the durability of the rotary switch. The watertight configuration also makes it possible to install the rotary switch of the present invention in a high-moisture environment or even in a liquid. Thus, the applicability of the rotary switch is widened.

4. The present invention turns on or off, or controls the magnitude of power supplied from, an external power source by outputting a coded signal. As the coded signal may be a digital signal in a pulse-width modulation format, a higher control precision than the conventional mechanical rotary switches would allow can be achieved.

5. When the rotary switch of the present invention is operated by a rotary touch, the first light-emitting elements corresponding to the touched portion of the peripheral region of the sensing surface can emit light or stop emitting light in response to the touch. The emission of light or a cessation thereof serves as a notification to the user of the current use state of the rotary switch.

6. As the touch control circuit board is provided in an interior space of the housing between the light-permeable element and the lower cover, the operation and durability of the touch control circuit board will not be compromised by external moisture.

7. The at least one second light-emitting element may function as an execution button for controlling an external power source and hence adds to the utility of the rotary switch of the present invention.

8. The vibration motor can provide a further notification to the user of the current use state of the rotary switch of the present invention.

DETAILED DESCRIPTION OF THE INVENTION

Figure 1:
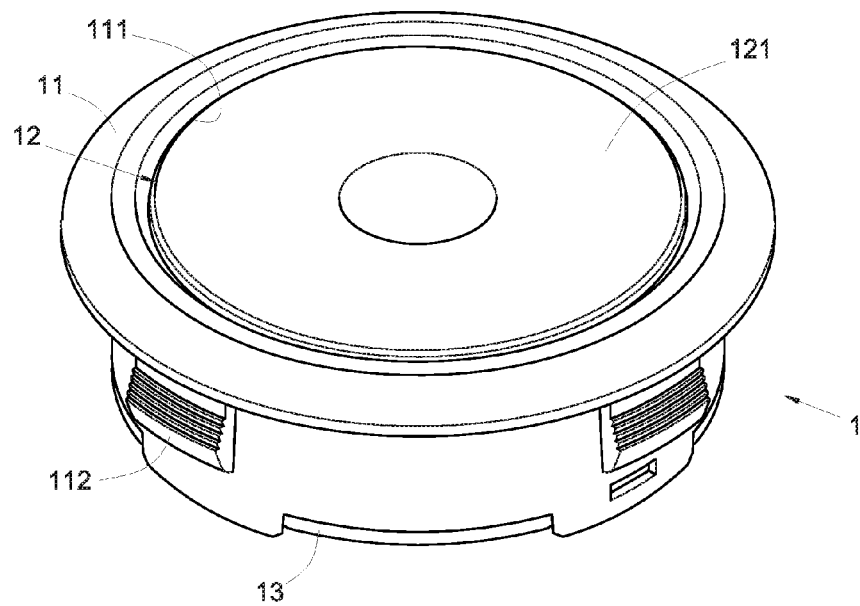
FIG. 1 is a perspective view of a preferred embodiment of the present invention.
Figure 2:
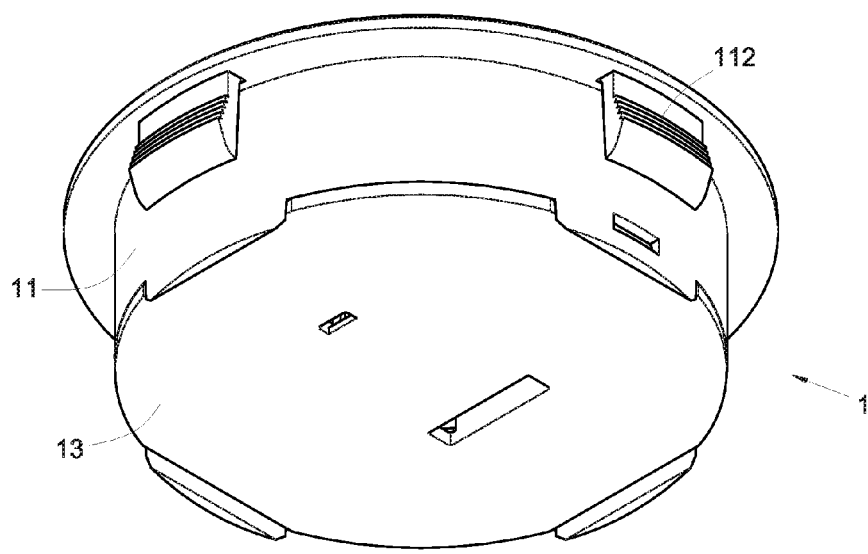
FIG. 2 is a perspective bottom view of the embodiment depicted in FIG. 1.
Figure 3:
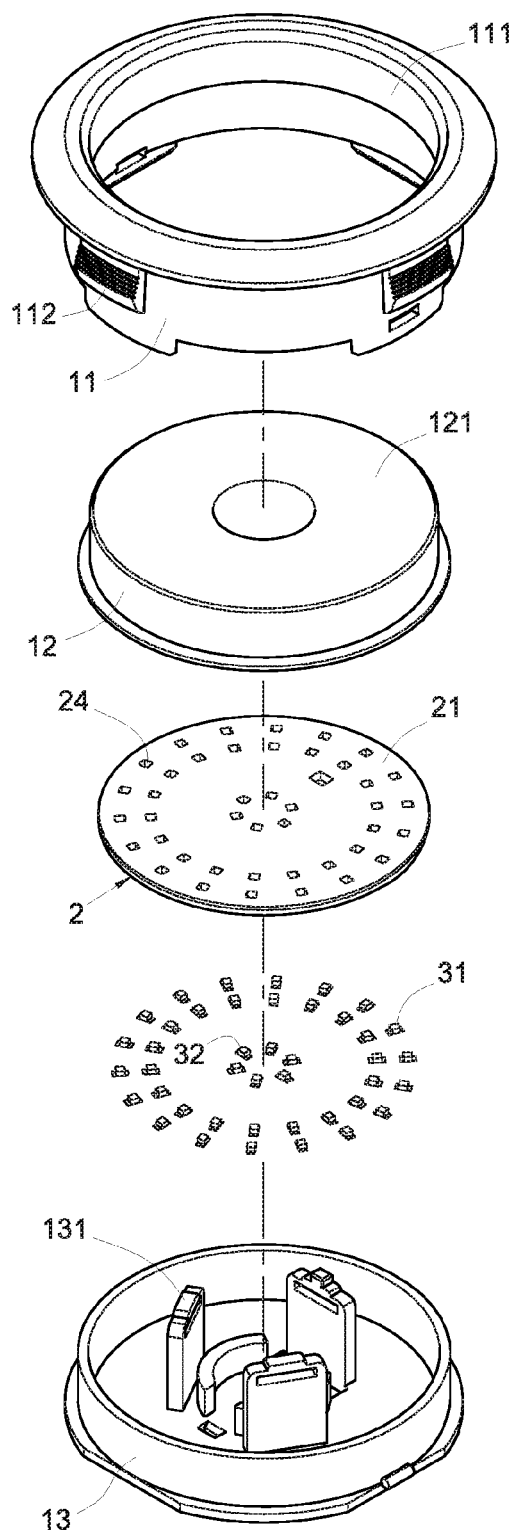
FIG. 3 is an exploded perspective view of the embodiment depicted in FIG. 1.
Figure 4:
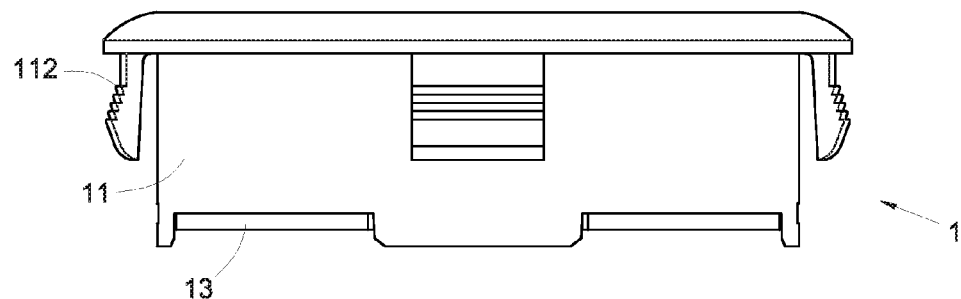
FIG. 4 is a front view of the embodiment depicted in FIG. 1.
Figure 5:
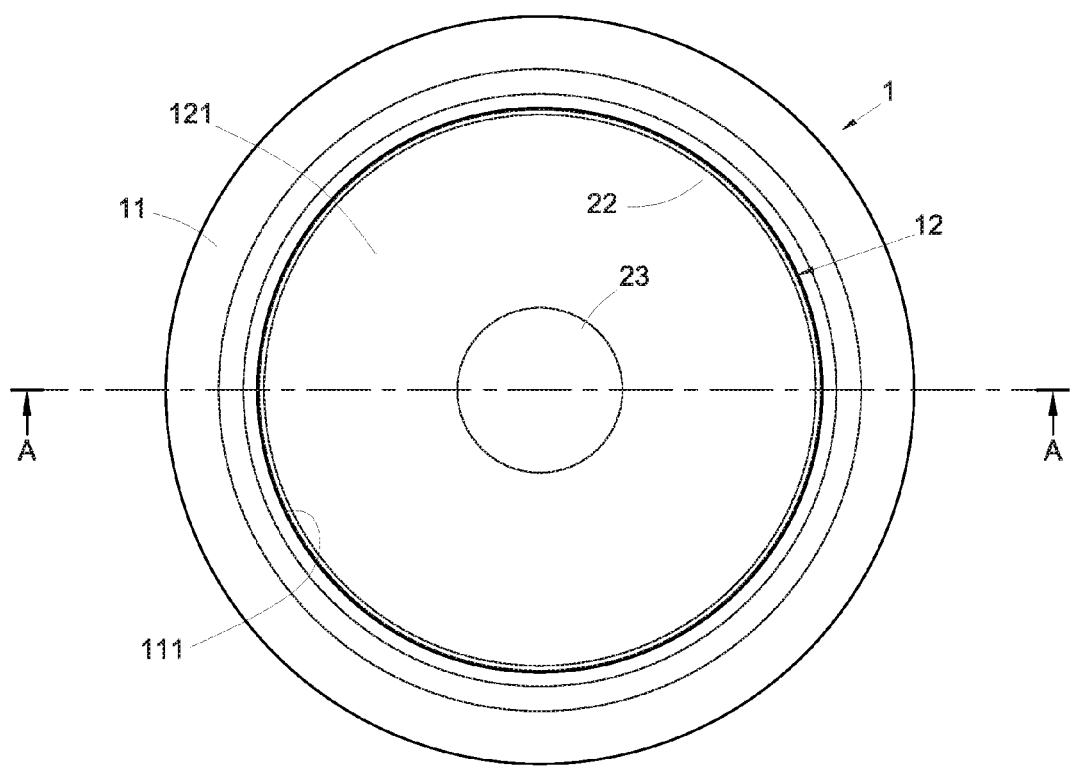
FIG. 5 is a top view of the embodiment depicted in FIG. 1.
Figure 6:
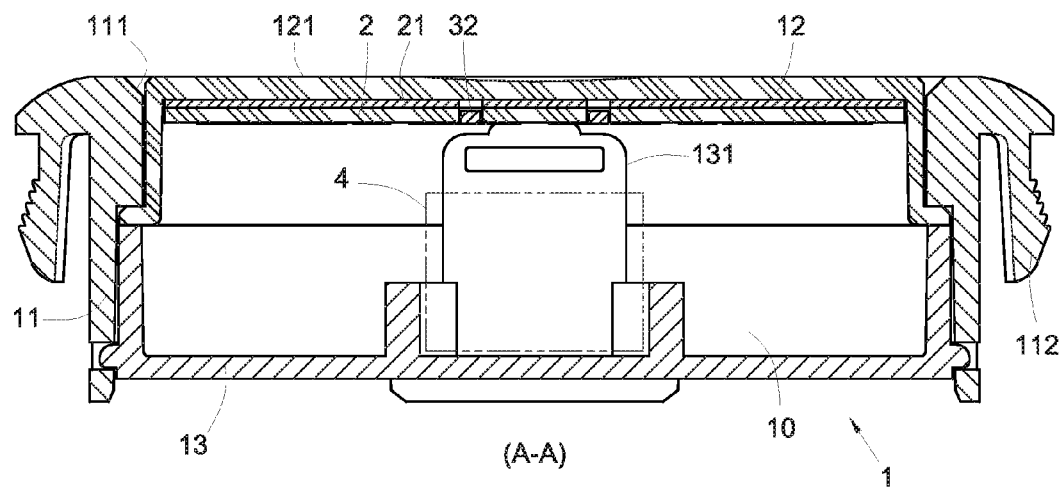
FIG. 6 is a sectional view taken along line A-A of FIG. 5.
Figure 7:
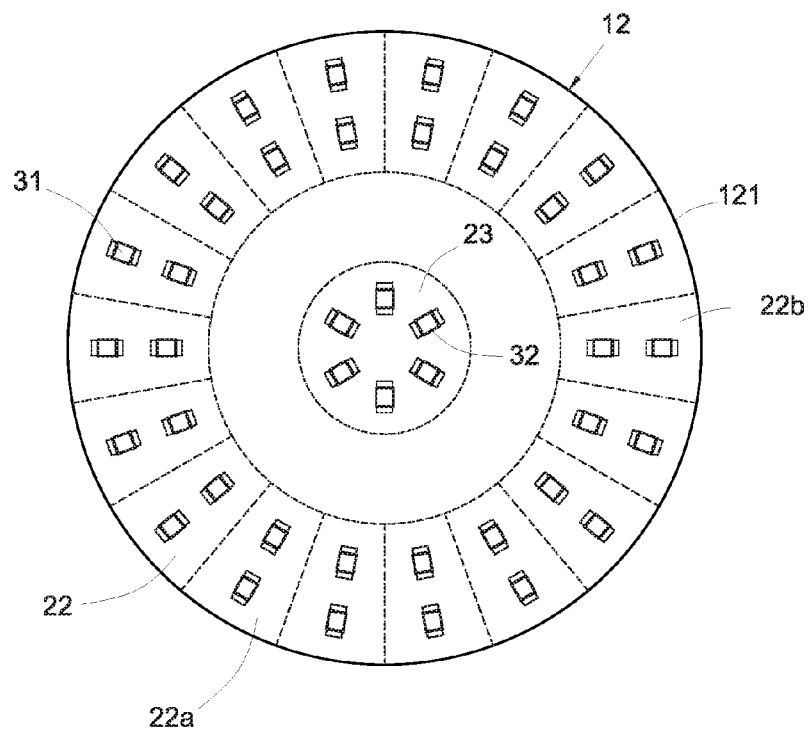
FIG. 7 is a partial enlarged top view of FIG. 5.
Figure 8:
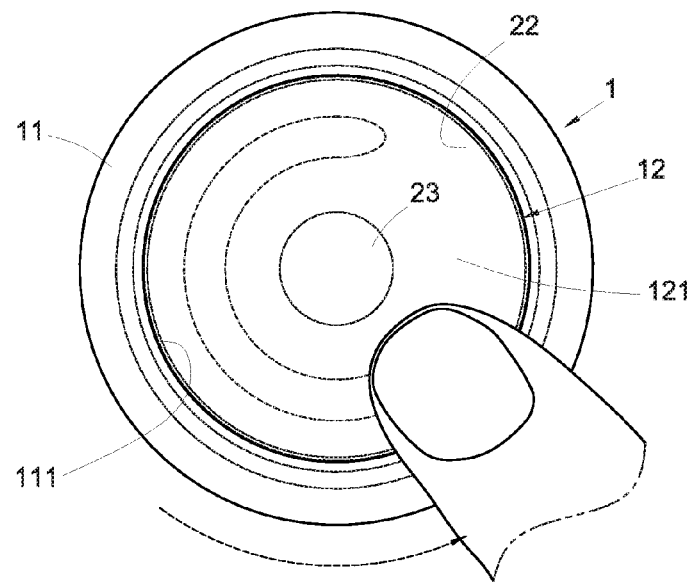
FIG. 8 is a top view similar to FIG. 5, illustrating a state of use.
Figure 9:
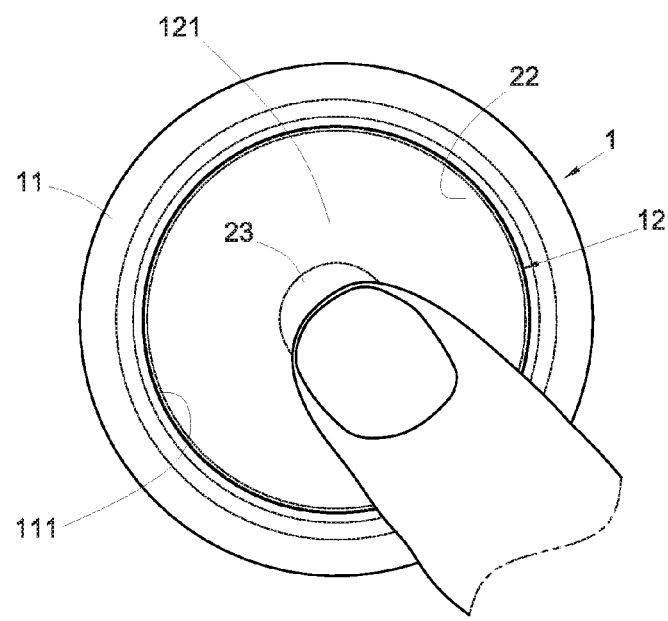
FIG. 9 is another top view similar to FIG. 5, illustrating another state of use.

Please refer to FIG. 1 for a perspective view of a preferred embodiment of the present invention; FIG. 2 for a perspective bottom view of the embodiment depicted in FIG. 1; FIG. 3 for an exploded perspective view of the embodiment depicted in FIG. 1; FIG. 4 for a front view of the embodiment depicted in FIG. 1; FIG. 5 for a top view of the embodiment depicted in FIG. 4; FIG. 6 for a sectional view taken along line A-A of FIG. 5; FIG. 7 for a partial enlarged top view of FIG. 5; FIG. 8 for a top view similar to FIG. 5, illustrating a state of use; and FIG. 9 for another top view similar to FIG. 5, illustrating another state of use. As shown in FIG. 1 through FIG. 9, the touch-sensitive rotary switch of the present invention includes a housing 1, a touch control circuit board 2, and a plurality of first light-emitting elements 31.

The housing 1 forms a receiving chamber 10 therein and has a top portion forming a sensing surface 121 to be touched by a human hand.

The touch control circuit board 2 is provided in a top portion of the receiving chamber 10. The top surface of the touch control circuit board 2 is provided with a resistive or capacitive touch control circuit layer 21 adjacent to the sensing surface 121 of the housing 1. The top surface of the touch control circuit layer 21 has a peripheral region divided into a plurality of annularly arranged sensing areas 22.

The first light-emitting elements 31, which may be light-emitting diodes, are annularly provided in the sensing areas 22 on the top surface of the touch control circuit layer 21 and are arranged in a spaced manner along a band corresponding to a peripheral region of the sensing surface 121.

A user may sequentially trigger the sensing areas 22 of the touch control circuit layer 21 by touching the sensing surface 121 along its peripheral region, so as for the portion of the touch control circuit layer 21 that corresponds to the triggered sensing areas 22 to control light emission of the first light-emitting elements 31 corresponding to the triggered sensing areas 22. The phrase "to control light emission of the first light-emitting elements 31" refers to driving the first light-emitting elements 31 to emit light or not to emit light. The portion of the touch control circuit layer 21 that corresponds to the triggered sensing areas 22 also outputs a coded signal according to the triggered sensing areas 22 in order to control the power supplied from an external power source.

More specifically, the present invention further includes the following technical features:

The housing 1 includes an upper cover 11 and a lower cover 13. A window 111 is provided in a top portion of the upper cover 11, and a light-permeable element 12 is provided in the window 111. The sensing surface 121 is the top surface of the light-permeable element 12. The touch control circuit board 2 is provided in an interior space of the receiving chamber 10 between the light-permeable element 12 and the lower cover 13, lest external moisture impair the operation, or reduce the service life, of the touch control circuit board 2.

The upper cover 11 is externally provided with a plurality of resilient engaging portions 112 which have teeth and are spaced from one another. The housing 1 can be secured in position by engagement of the engaging portions 112, thereby protecting the circuit at the bottom of the housing 1 from external moisture which may otherwise seep into the bottom of the housing 1 through the outer periphery of the upper cover 11.

A user may touch the sensing surface 121 stepwise along its peripheral region to sequentially turn on or off the first light-emitting elements 31 corresponding to the touched portion of the peripheral region of the sensing surface 121 and drive the touch control circuit layer 21 to output a coded signal.

The coded signal can turn on an external power source and/or gradually increase the power supplied from the external power source to an electric appliance. Alternatively, the coded signal can gradually decrease the power supplied from the external power source to the electric appliance and/or turn off the external power source.

The coded signal may be in a pulse-width modulation (PWM) format, wherein pulse-width modulation is a technique for converting an analog signal into a pulse. Generally speaking, a pulse generated from such conversion has a fixed period, but the duty cycle of the pulse depends on the magnitude of the source analog signal. As the present invention turns on or off an external power source and controls its power output by outputting a coded signal, the precision of control is higher than a conventional mechanical rotary switch would allow.

In this preferred embodiment, the rotary switch further includes at least one second light-emitting element 32. As shown in the drawings, the second light-emitting elements 32 are provided at the center of the top surface of the touch control circuit layer 21 and are surrounded by the sensing areas 22. Thus, the center of the top surface of the touch control circuit layer 21 forms a pressing area 23 corresponding to the center of the sensing surface 121. The user may trigger the pressing area 23 of the touch control circuit layer 21 by touching the center of the sensing surface 121, so as for the portion of the touch control circuit layer 21 that corresponds to the pressing area 23 to control light emission of the second light-emitting elements 32 and output a control signal for controlling the power supplied from an external power source.

The at least one second light-emitting element 32 may also be one or more light-emitting diodes. In addition, the at least one second light-emitting element 32 can change its light color when the user touches the center of the sensing surface 121.

The touch control circuit board 2 is provided with a plurality of receiving holes 24 in which the first light-emitting elements 31 and the at least one second light-emitting element 32 are embedded.

The lower cover 13 at the bottom of the receiving chamber 10 is annularly provided with a plurality of supporting elements 131. The touch control circuit board 2 is provided on a top portion of the supporting elements 131 such that the touch control circuit layer 21 of the touch control circuit board 2 lies against the bottom surface of the upper cover 11.

A vibration motor 4 is provided at a position surrounded by the supporting elements 131 and is electrically connected to the touch control circuit layer 21. The vibration motor 4 can be driven to vibrate by the control signal, thus notifying the user of the current use state of the rotary switch of the present invention.

The present invention can be implemented with the components described above. The housing 1 can be inserted into a positioning hole (not shown) on the surface of a predetermined location, wherein the predetermined location may be an indoor or outdoor wall easily accessible by a human hand, a home appliance, or a piece of bathroom equipment. The touch control circuit board 2 can be connected through the positioning hole to an external power source and a consumer electronic product such as a computer, a communication device, or a home appliance.

Normally, the peripheral region of the sensing surface 121 is provided with a starting mark indicating the sensing area 22 to be touched first. When touching the peripheral region of the sensing surface 121, the user may start where the starting mark is located.

When the peripheral region of the sensing surface 121 is touched by the user's finger along an arcuate path, the portion of the touch control circuit layer 21 that falls within the sensing areas 22 corresponding to the touched portion of the peripheral region of the sensing surface 121 is driven to generate a coded signal. Moreover, when the user's touch sequentially triggers a first sensing area 22 and a second sensing area 22a in such a way that, as soon as the second sensing area 22a is triggered, the touch stops triggering the first sensing area 22, the first light-emitting elements 31 corresponding to the first sensing area 22 continue emitting light. When the first sensing area 22 is triggered again by the user's touch, the first light-emitting elements 31 that correspond to the first sensing area 22 and have been emitting light stop light emission.

After the user touches the peripheral region of the sensing surface 121 along an arcuate path, the first light-emitting elements 31 located in the sensing areas 22, 22a that correspond to the touched portion of the peripheral region of the sensing surface 121 keep emitting light, whereas the first light-emitting elements 31 located in the sensing areas 22b that correspond to the untouched portion of the peripheral region of the sensing surface 121 do not emit light. Consequently, the light emitted by the first light-emitting elements 31 forms an arc (hereinafter referred to as an arcuate light) on the sensing surface 121.

In the meantime, the touch control circuit layer 21 outputs a coded signal according to the sensing areas 22, 22a that correspond to the touched portion of the peripheral region of the sensing surface 121. More specifically, the number of the sensing areas 22, 22a that correspond to the touched portion of the peripheral region of the sensing surface 121 determines the degree to which the rotary switch of the present invention is turned on. In other words, the longer the arcuate light is, the more the rotary switch is turned on; and the more the rotary switch is turned on, the more power is supplied from the external power source under control. Conversely, the shorter the arcuate light is, the less the rotary switch is turn on; and the less the rotary switch is turned on, the less power is supplied from the external power source under control.

The turning off of the rotary switch of the present invention may be so designed that the user's touch must not begin with an arbitrary sensing area 22, 22a, 22b but is required to start with the last-triggered sensing area 22, 22a, 22b in the previous touch. Then, the user's touch must move backward until all the first light-emitting elements 31 that have been emitting light are turned off, which is achieved when all the corresponding sensing areas 22 are once again triggered by the user's touch. Meanwhile, the touch control circuit layer 21 outputs a coded signal according to the sensing areas 22, 22a, 22b that have just now been triggered by the user's touch and turned off those first light-emitting elements 31.

Thus, when the rotary switch of the present invention is operated with a rotary touch, the first light-emitting elements 31 corresponding to the touched portion of the peripheral region of the sensing surface 121 can emit light or stop emitting light in response to the touch, thereby notifying the user of the current use state of the rotary switch. At the same time, a coded signal is output to turn on or off, or control the magnitude of power supplied to an electric appliance from, an external power source, thereby turning on or off, or controlling the operation of, the electric appliance.

It should be pointed out that the present invention allows the user to touch the peripheral region of the sensing surface 121 with a rotary motion that the user is accustomed to. This simplifies and facilitates arbitrary adjustment and control of the power supplied from an external power source to an electric appliance, and the operation required can be rapidly done.

Unlike the conventional mechanical rotary switches, the present invention uses the touch control circuit board 2 to realize touch-sensitive adjustment of the power supplied from an external power source. As a result, the drawbacks of the conventionally required mechanical components (e.g., high chances of wear and tear and getting stuck) are avoided, and the rotary switch of the present invention is far more durable and has a much longer service life than the conventional mechanical rotary switches.

Moreover, in the absence of the conventional mechanical rotating components, the housing 1 may have a watertight configuration to effectively prevent liquid from seeping into the rotary switch and thus further extend the service life of the rotary switch. The watertight configuration also enables the rotary switch of the present invention to be installed where moisture is high, even in a liquid. Thus, the rotary switch is suitable for a wide variety of applications.

In addition, a user may touch or, more precisely, press the center of the sensing surface 121 to trigger the pressing area 23 of the touch control circuit layer 21, so as for the portion of the touch control circuit layer 21 that corresponds to the pressing area 23 to control light emission of the at least one second light-emitting element 32 and output a control signal for controlling the power supplied from an external power source. As such, the at least one second light-emitting element 32 functions as an execution button for controlling the external power source and makes the rotary switch of the present invention more useful.

According to the above, the present invention is so designed that the power supply state of an external power source can be adjusted by touching the peripheral region of the sensing surface 121 with a rotary motion, thereby achieving the aforesaid objects of turning on or off, or adjusting stepwise the power supplied from, an external power source by a touch along a rotary path and increasing the service life of a rotary switch. Besides, the operation required for adjusting the power from an external power source by touch is simple, convenient, and practical.

Apart from that, the user's touch may sequentially trigger the first sensing area 22 and the second sensing area 22a in such a way that, once the first sensing area 22 is no more triggered by the touch, the first light-emitting elements 31 corresponding to the first sensing area 22 stop emitting light. Differently put, the first light-emitting elements 31 corresponding to the first sensing area 22 continue emitting light as long as the first sensing area 22 is triggered by the user's touch, and the same first light-emitting elements 31 will not be turned off until the user's touch triggers the second sensing area 22a instead and thus causes the first light-emitting elements 31 corresponding to the second sensing area 22a to emit light. That is to say, only the first light-emitting elements 31 in a single sensing area 22 can emit light at any given moment. It is also feasible to start touching the peripheral region of the sensing surface 121 from a position corresponding to a sensing area 22 other than that indicated by the starting mark, with all the other components and the mode of implementing the present invention being the same as those in the previous embodiment.

What is claimed is:

1. A touch-sensitive rotary switch, comprising:
    a housing forming a receiving chamber therein, the housing having a top portion forming a sensing surface to be touched by a human hand;
    a touch control circuit board provided in a top portion of the receiving chamber, the touch control circuit board having a top surface provided with a touch control circuit layer adjacent to the sensing surface, the touch control circuit layer having a top surface whose peripheral region is divided into a plurality of annularly arranged sensing areas; and
    a plurality of first light-emitting elements annularly provided in the sensing areas on the top surface of the touch control circuit layer and arranged in a spaced manner along a band corresponding to a peripheral region of the sensing surface;
    wherein the sensing surface can be touched along the peripheral region thereof to sequentially trigger the sensing areas of the touch control circuit layer, so as for a portion of the touch control circuit layer that corresponds to the triggered sensing areas to control light emission of the first light-emitting elements corresponding to the triggered sensing areas and, according to the triggered sensing areas, output a coded signal for controlling power supplied from an external power source.

2. The touch-sensitive rotary switch of claim 1, wherein the housing comprises an upper cover and a lower cover, the upper cover having a top portion provided with a window, there being a light-permeable element provided in the window, the sensing surface being a top surface of the light-permeable element, the touch control circuit board being provided between the light-permeable element and the lower cover.

3. The touch-sensitive rotary switch of claim 1, wherein when the sensing surface is touched stepwise along the peripheral region thereof, the first light-emitting elements corresponding to a touched portion of the peripheral region of the sensing surface are turned on or off stepwise, and the touch control circuit layer is driven to output the coded signal.

4. The touch-sensitive rotary switch of claim 3, wherein when a said sensing area is triggered by a touch and subsequently stops being triggered by the touch, the first light-emitting elements corresponding to the sensing area keep emitting light, and when the sensing area is once again triggered by a touch, the first light-emitting elements corresponding to the sensing area stop emitting light.

5. The touch-sensitive rotary switch of claim 3, wherein when a said sensing area is triggered by a touch and subsequently stops being triggered by the touch, the first light-emitting elements corresponding to the sensing area stop emitting light.

6. The touch-sensitive rotary switch of claim 1, wherein the coded signal turns on the external power source and/or gradually increases the power supplied from the external power source, or the coded signal gradually decreases the power supplied from the external power source and/or turns off the external power source.

7. The touch-sensitive rotary switch of claim 1, wherein the coded signal is in a pulse-width modulation format.

8. The touch-sensitive rotary switch of claim 1, further comprising at least a second light-emitting element provided at a center of the top surface of the touch control circuit layer and surrounded by the sensing areas such that the center of the top surface of the touch control circuit layer forms a pressing area corresponding to a center of the sensing surface, wherein the center of the sensing surface can be touched to trigger the pressing area of the touch control circuit layer, so as for a portion of the touch control circuit layer that corresponds to the pressing area to control light emission of the at least a second light-emitting element and output a control signal for controlling the power supplied from the external power source.

9. The touch-sensitive rotary switch of claim 8, wherein the at least a second light-emitting element changes a light color thereof when the center of the sensing surface is touched.

10. The touch-sensitive rotary switch of claim 8, wherein the receiving chamber has a bottom portion provided with a plurality of supporting elements, the touch control circuit board is provided on a top portion of the supporting elements, and a vibration motor to be driven by the control signal is provided at a position surrounded by the supporting elements.

\* \* \* \* \*